(12) United States Patent
Berchin et al.

(10) Patent No.: US 12,332,288 B2
(45) Date of Patent: Jun. 17, 2025

(54) SYSTEMS AND METHODS FOR ESTIMATING NEUTRAL IMPEDANCE AND DETECTING FAULTED NEUTRAL CONNECTION IN AN ELECTRICAL METER

(71) Applicant: Aclara Technologies LLC, St. Louis, MO (US)

(72) Inventors: Gregory Berchin, Wright City, MO (US); Lakshan Prageeth Piyasinghe, St. Charles, MO (US); Kartikeya Tripathi, Clarksburg, MD (US); Lawrence R. Kremer, St. Peters, MO (US); Mukesh Kumar Chippa, Aurora, OH (US); David W. Rieken, St. Peters, MO (US)

(73) Assignee: Aclara Technologies LLC, St. Louis, MO (US)

( * ) Notice: Subject to any disclaimer, the term of this patent is extended or adjusted under 35 U.S.C. 154(b) by 0 days.

(21) Appl. No.: 18/267,165

(22) PCT Filed: Apr. 28, 2023

(86) PCT No.: PCT/US2023/020327
§ 371 (c)(1),
(2) Date: Jun. 14, 2023

(87) PCT Pub. No.: WO2023/212280
PCT Pub. Date: Nov. 2, 2023

(65) Prior Publication Data
US 2025/0044330 A1    Feb. 6, 2025

Related U.S. Application Data

(60) Provisional application No. 63/440,660, filed on Jan. 23, 2023, provisional application No. 63/336,752, filed on Apr. 29, 2022.

(51) Int. Cl.
*G01R 22/06* (2006.01)
*G01R 27/18* (2006.01)

(52) U.S. Cl.
CPC .......... *G01R 22/068* (2013.01); *G01R 27/18* (2013.01)

(58) Field of Classification Search
CPC ............................. G01R 22/068; G01R 27/18
See application file for complete search history.

(56) References Cited

U.S. PATENT DOCUMENTS

| | | | |
|---|---|---|---|
| 6,828,771 B1 | 12/2004 | Ghassemi | |
| 2007/0067119 A1* | 3/2007 | Loewen | G01R 22/065 702/57 |

(Continued)

OTHER PUBLICATIONS

PCT/US2023/20327 International Search Report and Written Opinion dated Jul. 11, 2023.

*Primary Examiner* — Jermele M Hollington
*Assistant Examiner* — Zannatul Ferdous
(74) *Attorney, Agent, or Firm* — Michael Best & Friedrich LLP

(57) ABSTRACT

An electric utility meter includes a housing, an input configured on the housing that receives input electricity from an electricity source, and a controller having an electronic processor and a memory. The electronic processor is configured to measure a first characteristic and a second characteristic of the input electricity, determine a fault parameter value, calculate a confidence score corresponding to the fault parameter value, compare the confidence score to a threshold value, and determine that a fault is occurring based on the confidence score exceeding the threshold value.

18 Claims, 16 Drawing Sheets

(56) References Cited

U.S. PATENT DOCUMENTS

| | | | |
|---|---|---|---|
| 2010/0305889 A1* | 12/2010 | Tomlinson, Jr. | G06N 7/01 |
| | | | 702/62 |
| 2011/0148202 A1* | 6/2011 | Rada | G05F 1/70 |
| | | | 307/105 |
| 2012/0123708 A1 | 5/2012 | Dong et al. | |
| 2018/0123345 A1* | 5/2018 | Beebe | H02S 40/32 |
| 2018/0156886 A1 | 6/2018 | Lu et al. | |
| 2020/0203989 A1 | 6/2020 | Crittenden et al. | |
| 2021/0293873 A1 | 9/2021 | Sun | |

\* cited by examiner

SYSTEMS AND METHODS FOR ESTIMATING NEUTRAL IMPEDANCE AND DETECTING FAULTED NEUTRAL CONNECTION IN AN ELECTRICAL METER

FIELD

Embodiments relate to electrical meters.

SUMMARY

Facilities (for example, homes, businesses, etc.) receive electricity from distributions transformers. The distribution transformers transform high voltages received from power lines to voltages suitable for residential and commercial use (for example, 120 Volts Alternating Current (Vac) and/or 240 Vac). Electricity is provided to a facility using two line voltage cables (for example, power input cables) and a neutral cable from the transformer. A fault in the neutral cable may lead to a "floating neutral" occurring, which may cause an impact on customer experience and, in some cases, may lead to potentially dangerous conditions. For example, a floating neutral may create imbalances in the line-to-neutral voltages that cause lights to brighten when an appliance is activated, damage to equipment, and, in some scenarios, may pose a fire hazard.

Electrical meters may be installed at facilities to collect data regarding the incoming electricity. The electrical meters are electrically coupled to the facility via an electrical socket and collect data regarding the incoming electricity. Traditionally, electrical meters do not measure line-to-neutral voltages, thus making it difficult to determine the presence of a floating neutral, and often times a floating neutral is incorrectly inferred based on the insufficient data.

Floating neutral detection may be determined based on a distinction between faulted (for example, when there is a floating neutral) and no-fault cases (for example, when there is not a floating neutral). However, typically there is insufficient data for a faulted case since it is impractical to create artificial faulted conditions to determine a baseline for conditions that are sensed by the electrical meter during a floating neutral. Accordingly, it is advantageous to provide a system that estimates a no-fault neutral impedance, determines a confidence score based on the no-fault neutral impedance, and then determines whether a fault is occurring based on the confidence score.

Thus, one embodiment provides an electric utility meter includes a housing, an input configured on the housing that receives input electricity from an electricity source, and a controller having an electronic processor and a memory. The electronic processor is configured to measure a first characteristic and a second characteristic of the input electricity, determine a fault parameter value, calculate a confidence score corresponding to the fault parameter value, compare the confidence score to a threshold value, and determine that a fault is occurring based on the confidence score exceeding the threshold value.

In another embodiment, the invention provides a method. The method includes measuring a first characteristic and a second characteristic of an input electricity, determining a fault parameter value, calculating a confidence score corresponding to the fault parameter value, comparing the confidence score to a threshold value, and determining that a floating neutral is occurring based on the confidence score exceeding the threshold value In another embodiment, the invention provides a system for detecting a floating neutral. The system comprises an electricity source, power input cables, and an electrical meter. The electrical meter comprises a housing, an input configured on the housing that receives input electricity from the electricity source via the power input cable, and a controller having an electronic processor and a memory. The electronic processor is configured to measure a first characteristic and a second characteristic of the input electricity, determine fault parameter value, calculate a confidence score corresponding to the fault parameter value, compare the confidence score to a threshold value, and determine that a floating neutral is occurring based on the confidence score exceeding the threshold value.

Other aspects of the disclosure will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
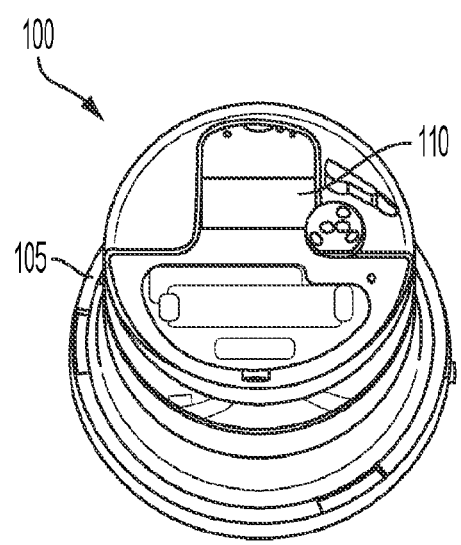
FIG. 1 is a perspective view illustrating an electrical meter according to some embodiments.
Figure 2:
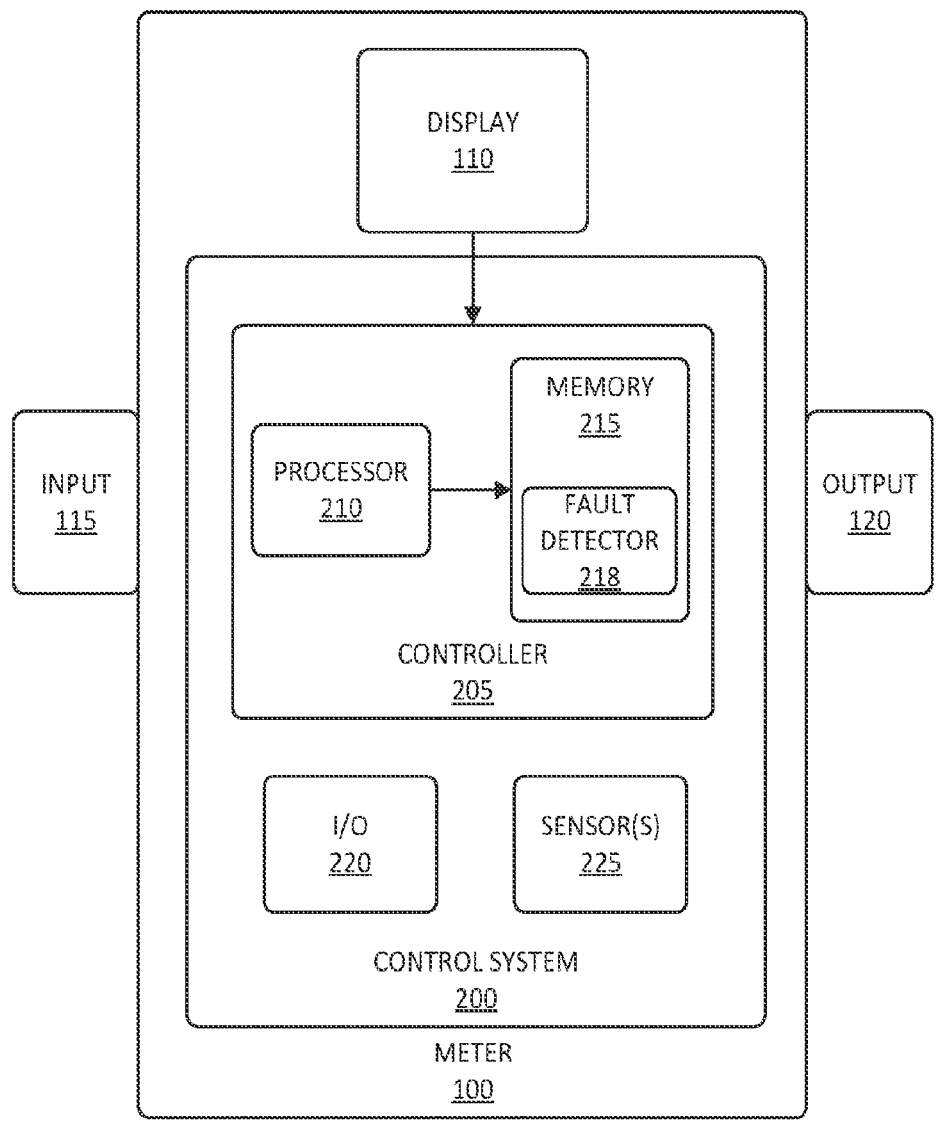
FIG. 2 is a block diagram illustrating the electrical meter of FIG. 1 according to some embodiments.

FIG. 1 illustrates a utility meter 100 according to some embodiments. The utility meter 100 may be configured to measure utility consumption (for example, electrical) by a user (for example, a residential user or a commercial user). The utility meter 100 may include a housing 105 and a display 110. The housing 105 may include various electrical and electronic components of the utility meter 100, such as but not limited to, an input 115 (FIG. 2) and an output 120 (FIG. 2). The input 115 may be configured to receive electricity from a utility (for example, transformer 305 (FIG. 3)), while the output 120 may be configured to output the electricity for user consumption. The display 110 may be configured to output information to a user. The display 110 may be any suitable display, for example, a liquid crystal display (LCD) touch screen, or an organic light-emitting diode (OLED) touch screen. In some embodiments, the utility meter 100 may be a form 2s meter. Alternatively, in some embodiments, the utility meter 100 may be any split-phase electric meter that does not have an electrical connection to a neutral conductor.

FIG. 2 is a block diagram illustrating the utility meter 100 according to some embodiments. In the illustrated embodiment, the utility meter 100 further includes a control system 200 including a controller 205. In some embodiments, the control system 200 is implemented wholly or partially on a printed-circuit board contained within the housing 105.

The controller 205 may have a plurality of electrical and electronic components that provide power, operational control, and protection to the components. For example, but not limited to, an electronic processor 210, a memory 215, and a fault detector 218. The electronic processor 210 obtains and provides information (for example, from the memory 215), and processes the information by executing one or more software instructions or modules, capable of being stored, for example, in a random access memory ("RAM") area of the memory 215 or a read only memory ("ROM") of the memory 215 or another non-transitory computer readable medium (not shown). The software can include firmware, one or more applications, program data, filters, rules, one or more program modules, and other executable instructions. The memory 215 can include one or more non-transitory computer-readable media, and includes a program storage area and a data storage area. The program storage area and the data storage area can include combinations of different types of memory, as described herein. The electronic processor 210 is configured to retrieve from the memory 215 and execute, among other things, software related to the control processes and methods described herein.

The program storage area of the memory 215 includes a fault detector 218. The fault detector includes a instructions divided between a first stage, a second stage, and a third stage that, when executed by the electronic processor 210, are used to determine if a fault is occurring. The fault detector 218 and the corresponding stages will be described below with respect to FIG. 5.

The controller 205 may be electrically and/or communicatively connected to a variety of modules and/or components of the utility meter 100. For example, the controller 205 may be electrically and/or communicatively coupled to an input/output (I/O) interface 220 and one or more sensors 225.

The I/O interface 220 may be configured to receive input and/or provide output to one or more external devices. For example, the I/O interface 220 may obtain information and signals from, and provide information and signals to, (for example, over one or more wired and/or wireless connections and/or optical connections) external devices. The external devices may include, but are not limited to, one or more servers, an external computer, a smart phone, and/or a tablet. In some embodiments, the I/O interface 220 is, or includes, an advanced metering infrastructure (AMI) module and/or a network interface controller (NIC).

The one or more sensors 225 may be configured to sense one or more characteristics of the meter 100 and/or the input power received from the transformer 305. In some embodiments, the one or more sensors 225 are configured to sense one or more electrical characteristics. In such an embodiment, the one or more electrical characteristics may include a voltage, a current, a power, and/or a temperature. In other embodiments, the one or more sensors 225 are configured to sense acoustical information of the meter 100. In yet other embodiments, the one or more sensors 225 are configured to sense environmental characteristics (for example, ozone) of the meter 100. In yet other embodiments, the one or more sensors 225 are configured to sense radio-frequency information.

In one embodiment of general operation, the meter 100 is configured to detect/determine the occurrence of a floating neutral impedance. For example, based on a detected voltage and detected currents, an impedance of a neutral conductor (for example, neutral conductor 320 (FIG. 3)) may be determined by the meter 100. In some embodiments, the controller 205 outputs an alert based on estimating that the neutral conductor is experiencing a floating neutral impedance.

Figure 3:
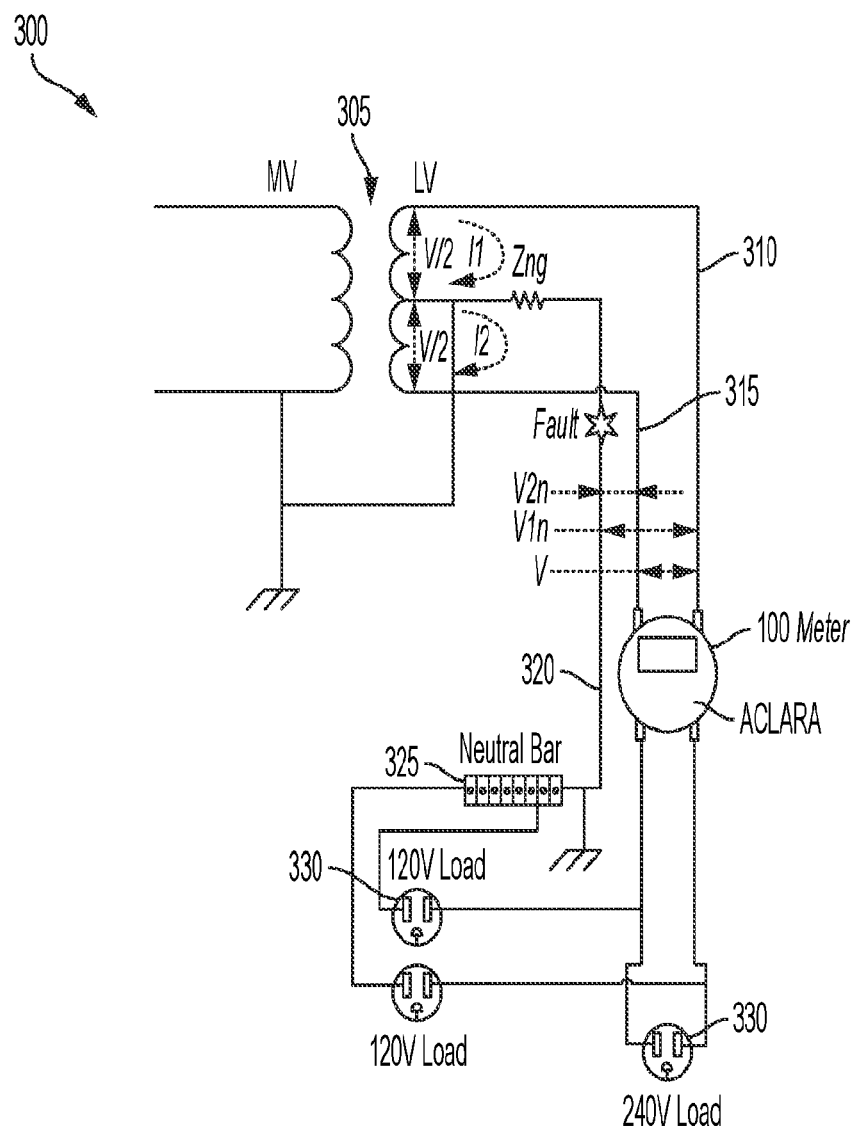
FIG. 3 is a schematic circuit diagram of an electrical system according to some embodiments.

FIG. 3 is a schematic circuit diagram of an electrical system 300. The electrical system 300 includes the transformer 305, a first input line 310, a second input line 315, the neutral conductor 320, the electrical meter 100, a neutral bar 325, and power sockets 330. The electrical system 300 includes a single phase 3-wire 120 Volt alternating current (Vac)/240 Vac (for example. "split phase") service.

The transformer 305 is a distribution transformer that supplies power to a facility from a power plant, via power lines. The transformer 305 steps down an input voltage from a high voltage (for example, 7,200 Vac) to a lower voltage (for example, 240 Vac) that can be output to a facility. The facility may include 120 Vac and 240 Vac power sockets 330 that appliances may be plugged into to receive electricity.

An input of the meter 100 may be electrically connected to the transformer 305 via the first input line 310 and the second input line 315. An output of the meter 100 may be electrically connected to at least one power socket 330. The first input line 310 may provide a first voltage (for example, +120 Vac) to the facility and the second input line 315 may provide a second voltage (for example, -120 Vac) to the facility. The meter 100 may determine a line-to-line voltage (for example, "V") between the first voltage and the second voltage, as well as a first current (for example, "$I_1$") and a second current (for example, "$I_2$"). In some embodiments, the meter 100 may determine line-to-neutral voltage for the first input line 310 (for example, "$V_{1n}$") and the second input line 315 (for example "$V_{2n}$"). Based on any combination of the determined voltages and currents, the meter 100 may determine/estimate a neutral impedance (for example, "$Z_{ng}$") that is the impedance along the neutral conductor 320.

The neutral conductor 320 may be connected to the neutral bar 325. In some embodiments, the neutral bar 325 may be provided in an electrical panel of a residential dwelling. As shown in FIG. 3, a fault may occur on the neutral conductor 320. When a fault occurs, electricity provided to appliances and other electrical components in a facility is imbalanced causing some appliances and electrical components to draw an unstable amount of electricity. For example, a power socket 330 may malfunction and be energized to a full 240 Vac, which can be detrimental to appliances and, in severe cases, result in a fire. A floating neutral, and therefore a fault, may be detected based on the neutral impedance that is calculated by the meter 100. When a floating neutral is detected, the estimated neutral impedance of the neutral conductor 320 may be greater than a few Ohms (Ω).

Figure 4:
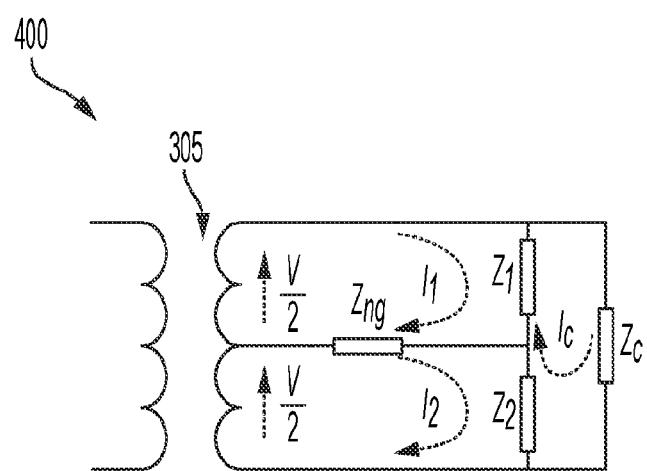
FIG. 4 is a lumped-parameter model of the schematic circuit diagram of FIG. 3 according to some embodiments.

FIG. 4 is a lumped-parameter model 400 of the electrical system 300. The lumped-parameter model 400 is a simplified circuit view of the electrical system 300. The controller 205 of the electrical meter 100 may calculate electrical characteristics of the electrical system 300 that are not sensed by the sensors 225 based on the lumped-parameter model 400. For example, the controller 205 may calculate the line-to-line voltage (for example, "V"), the first current (for example, "$I_1$"), the second current (for example, "$I_2$"), and, ultimately, the neutral impedance (for example, "$Z_{ng}$"). The first load impedance (for example, "$Z_1$") and the second load impedance (for example, "$Z_2$") may model 120. Vac appliances and the second load impedance may model 240. Vac appliances. In some embodiments, the neutral impedance may be a parallel combination of the impedance of a ground path through soil (for example $Z_{gnd}$) and a neutral wire (for example, $Z_{nw}$). For example, the ground path impedance is dependent on the type of grounding used in a facility (for example, a single rod electrode made of copper with an impedance that is less than 25Ω), a resistivity of soil, and a type of grounding used in the transformer 305. When a fault is detected, the neutral wire impedance may be equal to infinity ($Z_{nw}=\infty$) and, thus, the neutral impedance may be equal to the ground path impedance ($Z_{ng}=Z_{gnd}$) (for example, between 0Ω and 50Ω). When there is no fault, the neutral impedance may be equal to the neutral wire impedance ($Z_{ng}=Z_{nw}$) which may be around 0.01Ω.

The fault detector 218 may store instructions corresponding to circuit analysis that uses Kirchoff's Voltage Law (KVL) to deduce equations that the controller 205 may use to calculate the neutral impedance. In particular, applying KVL to the first current loop provides Equation 1 (below) and applying KVL to the second current loop provides Equation 2 (below). Both Equation 1 and Equation 2 may be stored in the fault detector 218 in the memory 215 of the controller 205.

$$\frac{V}{2} - Z_1(I_1 - I_c) - Z_{ng}(I_1 - I_2) = 0 \quad \text{(Equation 1)}$$

$$\frac{V}{2} - Z_{ng}(I_2 - I_1) - Z_2(I_2 - I_c) = 0 \quad \text{(Equation 2)}$$

In some embodiments, the controller 205 may accurately estimate the neutral impedance only if the first current or the second current are changing, the line-to-line current (for example, "$I_c$") is zero (for example, there are no 240 Vac line-to-line loads and/or the 240 Vac line-to-line loads are not changing), the derivative of the line-to-line current is zero (for example, the 240 Vac line-to-line loads are not changing), and the derivatives of either the first load impedance or the second load impedance are zero, but not both (for example, only one load impedance changes at a time). In some embodiments, if these conditions are not met, the controller 205 may still estimate the neutral impedance, however, the estimation may have a decreased accuracy. An event filter 500 (FIG. 5) may allow samples to pass through to the estimator 505 even if the conditions are not met.

In a healthy system with no fault and, thus, no floating neutral, the first current may be determined using Equation 3 (below) and the second current may be determined using Equation 4 (below). The line-to-line voltage (for example, "V"), is the sum of the first input line voltage and the second input line voltage.

$$I_1 = \frac{V}{2Z_1} + I_c \quad \text{(Equation 3)}$$

$$I_2 = \frac{V}{2Z_2} + I_c \quad \text{(Equation 4)}$$

In some embodiments, when the first current is equal to the second current (for example, $I_1=I_2$) the neutral conductor (for example, neutral conductor 320) is severed at the transformer itself or there is no 240 Vac load present. In some embodiments, when an appliance receiving 120 V from the first input line 310 is switched on or off, the current signature of the appliance is present in both the first current and the second current. This phenomenon is referred to as a "shadow" effect, where current in one input line 310, 315 imparts a shadow on the other input line 315, 310. The ratio of the shadow effect on the first input line to the second input line is proportional to the ratio of the second load impedance to the first load impedance. The shadow effect will be described in detail below with respect to FIG. 12.

Figure 5:
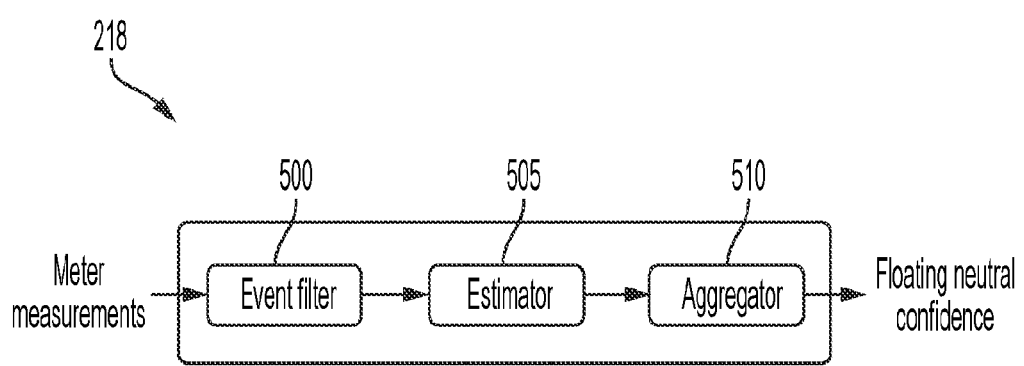
FIG. 5 is a block diagram illustrating a fault detector of the electrical meter of FIG. 1 according to some embodiments.

FIG. 5 is a block diagram of the fault detector 218. The fault detector 218 includes an event filter 500, an estimator 505, and an aggregator 510. The event filter 500 receives meter measurements as detected by the meter 100. Based on the lumped parameter model 400, the meter 100 detects the line-to-line voltage (for example, "V"), the first current (for example, "$I_1$"), and the second current (for example, "$I_2$"). In some embodiments, the line-to-line voltage and the currents are sampled at 16 kilo-Hertz (kHz) and 1 second(s) root mean square (RMS) values for the voltage and currents are determined. In some embodiments, the samples are taken in a range of 10 kHz to 20 kHz. The event filter 500 outputs the $k^{th}$ values for the line-to-line voltage (for example, V[k]), the first current (for example, $I_1$[k]), and the second current (for example, $I_2$[k]). For example, $k^{th}$ value is a value detected by the meter 100 during the 1 Hz RMS calculations. The output of the event filter 500 is inputted into the estimator 505.

The estimator 505 estimates the return line impedance (for example, "$Z_{ng}$"). The method used by the estimator 505 to estimate the return line impedance will be described below with respect to FIGS. 7 and 8. The aggregator 510 determines a floating neutral confidence score. The method used by the aggregator 510 to determine a floating neutral confidence score will be described below with respect to FIGS. 9 and 10.

Figure 6:
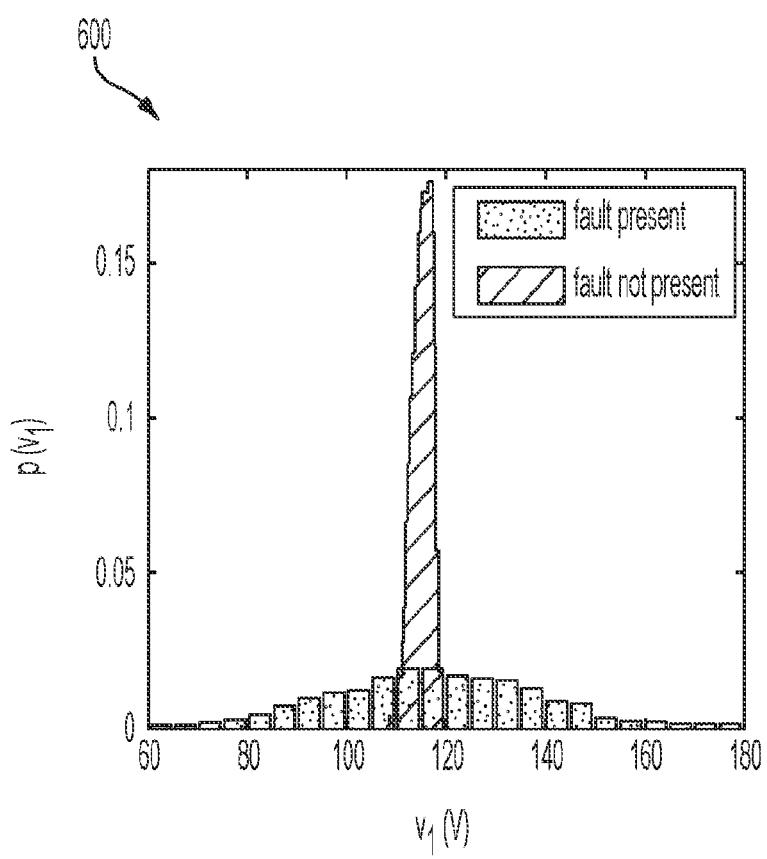
FIG. 6 is a graph illustrating a voltage magnitude distribution according to some embodiments.

FIG. 6 is a voltage magnitude distribution 600 with and without faults. For example, FIG. 6 is a voltage magnitude distribution 600 for the first input line 310. When no fault is present in in the voltage magnitude distribution 600, the voltage magnitude is tightly distributed at approximately 120 V. When a fault is present (for example, a floating neutral is occurring) the voltage magnitude may vary between 0 Vac and 240 Vac (with a ±5% voltage tolerance).

Figure 7:
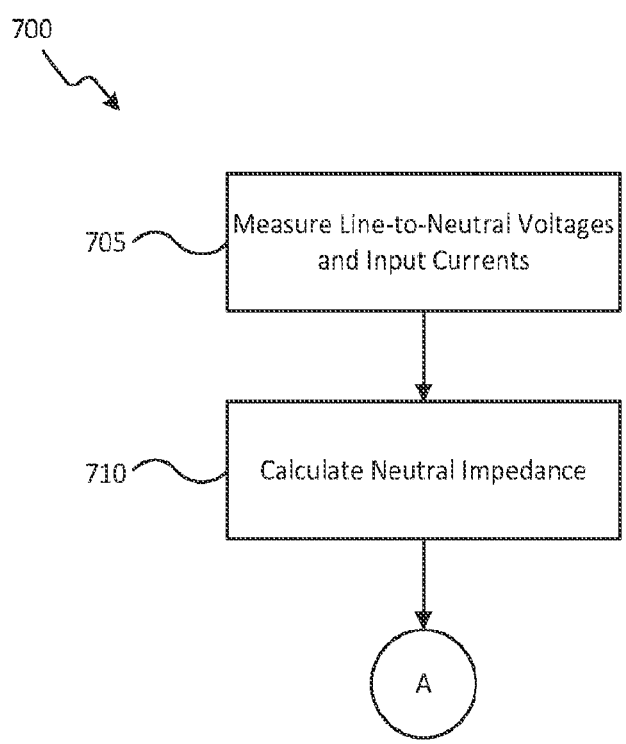
FIG. 7 is a flowchart illustrating a process of estimating a neutral impedance according to some embodiments.

FIG. 7 is a flowchart illustrating a process 700 of determining a neutral impedance. In some embodiments, the controller 205 of the utility meter 100 may estimate the neutral impedance based on measured and calculated electrical characteristics of the electrical system 300. For example, in the process 700, the utility meter 100 estimates the line-to-neutral voltages.

The process 700 begins by the controller 205 measuring the line-to-neutral voltages and input currents (block 705). For example, the sensors 225 may measure line-to-neutral voltage for the first input line 310 (for example, "$V_{1n}$") and the second input line 315 (for example "$V_{2n}$") and the first current (for example. "$I_1$") and the second current (for example, "$I_2$"). In some embodiments, the event filter 500 determines the line-to-neutral voltages and input currents at a specific sampled instance or instances. The controller 205 estimates the neutral impedance (for example, "$Z_{ng}$") (block 710). In some embodiments, the estimator 505 may be used to estimate the estimate impedance. The processor 210 may access equation that are previously deduced using basic circuit analysis applied to the first current loop and KVL (Equation 1). The previously deduced equations may solve for the line-to-line voltage (for example, "V") (Equation 5). The processor 210 may access Equation 5 that is stored in the fault detector 218 in the memory 215 of the controller 205 and Equation 6, such that the estimator 505 may use Equation 6 to determine the neutral impedance. The line-to-line voltage, is the sum of the first input line voltage and the second input line voltage.

$$\frac{V}{2} = V_{1n} + Z_{ng}(I_1 - I_2) \qquad \text{(Equation 5)}$$

$$Z_{ng} = \frac{\frac{V_{1n} + V_{2n}}{2} V_{1n}}{I_1 - I_2} \qquad \text{(Equation 6)}$$

Alternatively, or additionally, the estimator 505 may determine the neutral impedance based on previously deduced equations accessed by the processor 210. The previously deduced equations may be based on basic circuit analysis applied to the second current loop and KVL (Equation 2), that solves for the line-to-line voltage (Equation 7). The processor 210 may access Equation 7 that is stored in the fault detector 218 in the memory 215 of the controller 205 and produce Equation 8, that the estimator 505 may use to determine for the neutral impedance.

$$\frac{V}{2} = Z_{ng}(I_1 - I_2) + V_{2n} \qquad \text{(Equation 7)}$$

$$Z_{ng} = \frac{\frac{V_{1n} + V_{2n}}{2} V_{2n}}{I_1 - I_2} \qquad \text{(Equation 8)}$$

Figure 9:
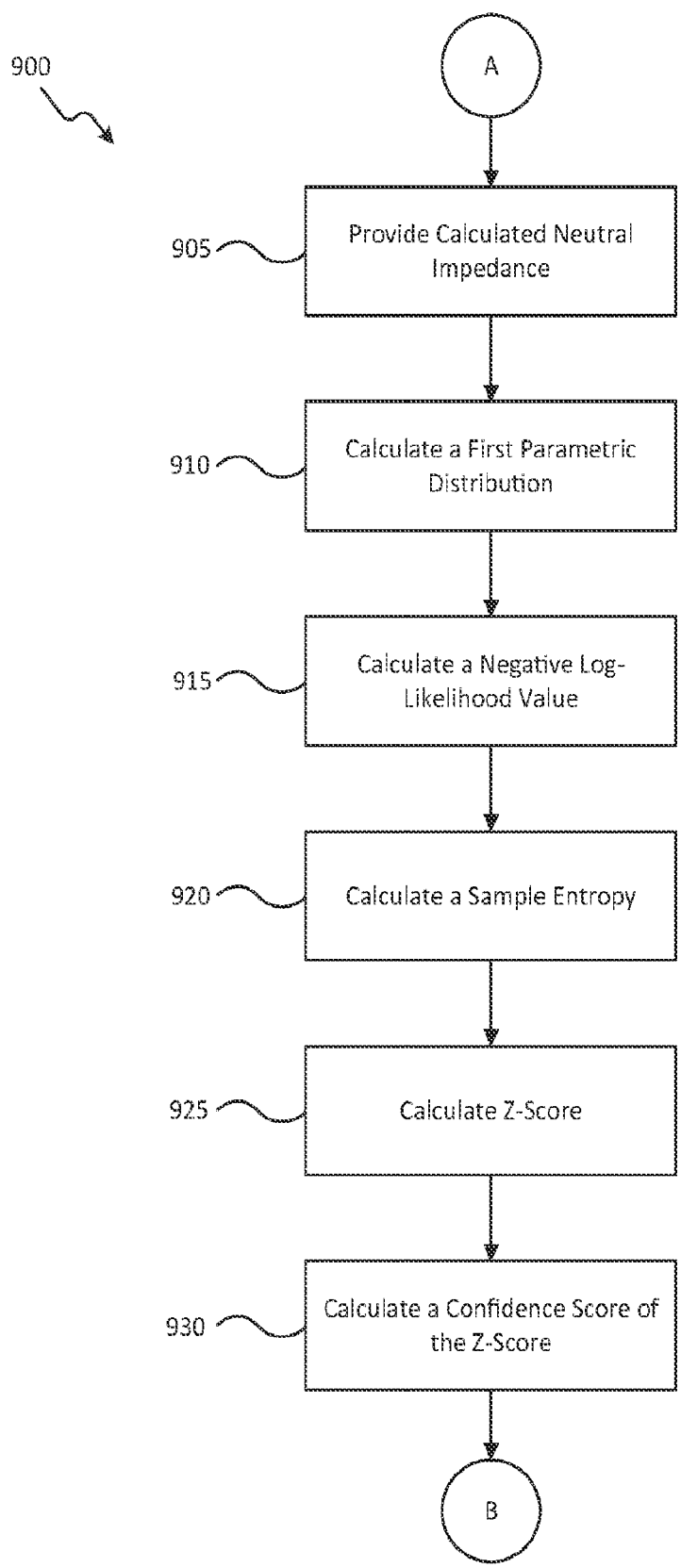
FIG. 9 is a flowchart illustrating a process of calculating a confidence score used to determine that a floating neutral is occurring according to some embodiments.

Once the neutral impedance is determined using either Equation 6 or Equation 8, the process 700 continues to process 900 (FIG. 9).

Figure 8:
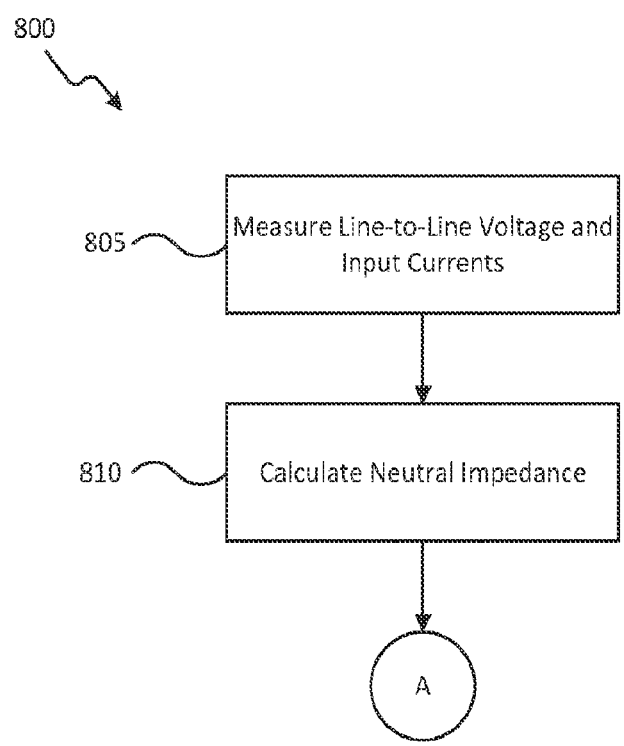
FIG. 8 is a flowchart illustrating a process of estimating a neutral impedance according to some embodiments.

FIG. 8 is a flowchart illustrating another process 800 of determining a neutral impedance. During the process 800, the controller 205 of the utility meter 100 may determine the neutral impedance based on the lumped-parameter model 400 of the electrical system 300. For example, in the process 800, the utility meter 100 measures the line-to-line voltage.

The process 800 begins by the controller 205 measuring the line-to-line voltage and input currents (block 805). For example, the sensors 225 may measure line-to-line voltage (for example "V"), the first current (for example, "$I_1$"), and the second current (for example, "$I_2$"). In some embodiments, the event filter 500 determines the line-to-line voltage and input currents at a specific sampled instance or instances. The controller 205 calculates the return line impedance (for example, "$Z_{ng}$") (block 810). In some embodiments, the estimator 505 may be used to calculate the return line impedance. The calculation may begin with the processor 210 accessing Equation 9 and Equation 10 in the fault detector 218 of the memory 215.

$$Z_{ng} = \frac{\frac{V}{2}}{I_1 \cdot \frac{Z_1 + Z_{ng}}{Z_{ng}} - I_2} \qquad \text{(Equation 9)}$$

$$Z_{ng} = \frac{\frac{V}{2}}{I_2 \cdot \frac{Z_2 + Z_{ng}}{Z_{ng}} - I_1} \qquad \text{(Equation 10)}$$

The processor 210 may also access Equation 11 and Equation 12 that solve for the first current and the second current in the fault detector 218.

$$I_1 = \frac{V}{2}\left(\frac{Z_2 + 2Z_{ng}}{Z_1 + Z_2 + Z_1 Z_{ng} + Z_2 Z_{ng}}\right) \qquad \text{(Equation 11)}$$

$$I_1 = \frac{V}{2}\left(\frac{Z_1 + 2Z_{ng}}{Z_1 + Z_2 + Z_1 Z_{ng} + Z_2 Z_{ng}}\right) \qquad \text{(Equation 12)}$$

After the processor 210 accesses Equation 11 and Equation 12 from the fault detector 218, the estimator 505 takes the derivative of each Equation 11 and Equation 12 and then divides the derivative equations by one another to yield a ratio of the derivatives. Equation 13 is a first ratio where the second load impedance changes, but the first load impedance does not. Equation 14 is a second ratio where the first load impedance changes, but the second load impedance does not. The derivatives are approximated by the estimator 505.

$$\frac{I_2'}{I_1'}\bigg|_{Z_1'=0} = \qquad \text{(Equation 13)}$$

$$\frac{0 \cdot (Z_2 Z_{ng} + 2Z_{ng}^2) + Z_2'(Z_1^2 + 3Z_1 Z_{ng} + 2Z_{ng}^2)}{0 \cdot (Z_2^2 + 3Z_2 Z_{ng} + 2Z_{ng}^2) + Z_2'(Z_1 Z_{ng} + 2Z_{ng}^2)} = \frac{Z_1 + Z_{ng}}{Z_{ng}}$$

$$\frac{I_2'}{I_1'}\bigg|_{Z_2'=0} = \qquad \text{(Equation 14)}$$

$$\frac{Z_1'(Z_2 Z_{ng} + 2Z_{ng}^2) + 0 \cdot (Z_1^2 + 3Z_1 Z_{ng} + 2Z_{ng}^2)}{Z_1'(Z_2^2 + 3Z_2 Z_{ng} + 2Z_{ng}^2) + 0 \cdot (Z_1 Z_{ng} + 2Z_{ng}^2)} = \frac{Z_{ng}}{Z_2 + Z_{ng}}$$

The estimator 505 may then use the combination of Equation 13 with Equation 9 that yields Equation 15 and the combination of Equation 14 with Equation 10 that yields Equation 16 to determine the neutral impedance. The components of Equation 15 and Equation 16 are all parameters that are measured by the meter 100 and known by the controller 205. For example, the line-to-line voltage, the first current, the second current, and the ratios of instantaneous changes between the first current and the second current are measured by the meter 100. In some embodiments, the estimator 505 may only determine the neutral impedance using Equation 15 or Equation 16 if the first load impedance or the second load impedance is not changing.

$$Z_{ng} = \frac{\frac{V}{2}}{I_1 \cdot \left(\frac{I_2'}{I_1'}|_{Z_1'=0}\right) - I_2} \quad \text{(Equation 15)}$$

$$Z_{ng} = \frac{\frac{V}{2}}{I_2 \cdot \left(\frac{I_2'}{I_1'}|_{Z_2'=0}\right)^{-1} - I_1} \quad \text{(Equation 16)}$$

Once the return line impedance is determined by the estimator 505 using either Equation 15 or Equation 16, the process 800 continues to process 900 (FIG. 9).

FIG. 9 is a flowchart illustrating a process 900 of calculating a confidence score used to determine that a floating neutral is occurring. During the process 900, the controller 205 calculates the confidence score of a z-score.

The process 900 continues from either process 700 (FIG. 7) or process 800 (FIG. 8). The controller 205 provides a calculated return path impedance (block 905). In some embodiments, the estimator 505 provides the aggregator 510 with the return line impedance (for example, "$Z_{ng}$") that is calculated at block 810 (FIG. 8). The aggregator 510 calculates a first parametric distribution (block 910). The first parametric distribution is a Half Cauchy distribution that is expressed by Equation 17. The Half Cauchy distribution is a no-fault distribution based on data that is determined and stored by the controller 205 during no-fault conditions. In some embodiments, gamma (for example, "$\gamma$") is a scaled parameter. For example, gamma may be in the range of 0.1 to 1.0. The likelihood of a given test impedance (for example, "$\hat{Z}_{ng}[k]$") is calculated using Equation 17. The given test impedance may be the same as the calculated return line impedance that is determined at block 810 (FIG. 8) at a certain instance. For example, the test impedance may be calculated for the $k^{th}$ sample taken by the meter 100 or the $k^{th}$ event passed through the event filter 500.

$$P_{H_0}(x;\gamma) = \begin{cases} \frac{2}{\pi\gamma} \frac{1}{1+x^2/\gamma^2}, & x \geq 0 \\ 0, & x < 0 \end{cases} \quad \text{(Equation 17)}$$

The aggregator 510 calculates a negative log-likelihood value (block 915). The negative log-likelihood value (for example, "f[k]") is calculated (Equation 18) to determine how well the test impedance fits the no-fault distribution calculated in Equation 17.

$$f[k] = -\ln[P_{H_0}(Z_{ng}[k])] \quad \text{(Equation 18)}$$

The aggregator 510 calculates a sample entropy (block 920). The sample entropy (for example, "l[k]") is calculated using Equation 19. The sample entropy is calculated using successive values of the calculated negative log-likelihood based on successive values of test impedances. In some embodiments the value of "n" is in the range of 20-100

$$l[k] = \frac{1}{n}\sum_{i=0}^{n-1} f[i] \quad \text{(Equation 19)}$$

Figure 10:
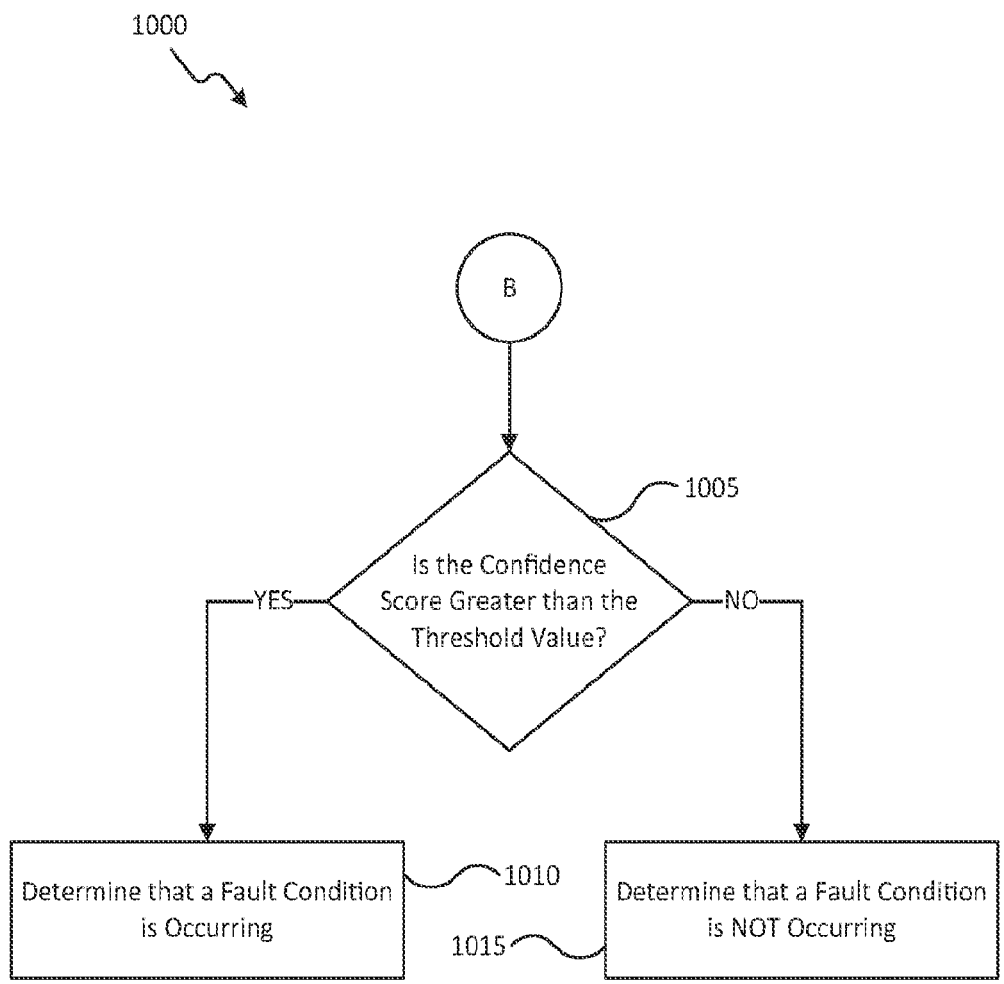
FIG. 10 is a flowchart illustrating a process of determining that a floating neutral is occurring based on the confidence score calculated by the process of FIG. 9 according to some embodiments.

The sample entropy may have an expected value (for example, "$E_0$") when the test impedances are from a no-fault distribution. Based on the expected value, a hypothesis test for the presence of a fault (for example, a floating neutral) may be created (Equation 20). In the hypothesis test, $\mu_l$=E[l] for the calculated sample entropy. The first hypothesis (for example, "$H_0$") is for a no-fault condition. The second hypothesis (for example, "$H_1$") is for a faulted condition. The hypothesis test may be performed by calculating a z-score. The hypothesis test may be evaluated by the controller 205, such as in process 1000 (FIG. 10).

$$H_0 : \mu_l = E_0 \quad \text{(Equation 20)}$$
$$H_1 : \mu_l > E_0$$

The aggregator 510 calculates the z-score (block 925). The z-score may be calculated using Equation 21, Equation 22, and Equation 23. The aggregator 510 calculates the expected value (Equation 21). The aggregator 510 calculates a variance (for example, "$\sigma^2$") (Equation 22). For example, when gamma is equal to 0.9969 the expected value is approximately 1.8347 and the variance is approximately 3.2898. In some embodiments, gamma is estimated to be 0.9969.

$$E_0 = -\int \ln[P_{H_0}(x)]P_{H_0}(x)dx = \ln(2\pi\gamma) \quad \text{(Equation 21)}$$

$$\sigma^2 = \int_0^\infty \left\{\ln\left[\frac{2}{\pi\gamma(1+x^2/\gamma^2)}\right] - E_0\right\}^2 \frac{2}{\pi\gamma(1+x^2/\gamma^2)}dx \quad \text{(Equation 22)}$$

The aggregator 510 may use the calculated expected value, the calculated variance, and Equation 23 to calculate the z-score. The z-score may indicate how much the sample entropy differs from the standard deviation (for example, "$\sigma$").

$$Z[k] = \frac{l[k] - E_0}{\sigma/\sqrt{n}} \quad \text{(Eqaution 23)}$$

The aggregator 510 calculates a confidence score of the z-score (block 930). The aggregator calculates the confidence score using Equation 24. The confidence score may be evaluated in terms of area under a standard Gaussian curve up to the calculated z-score value (for example, from Equation 23). As a fault condition develops in the neutral conductor, the mean of the log-likelihood shifts away from the expected value, thereby increasing the confidence score.

$$c[k] = \int_{-\infty}^{Z[k]} \frac{1}{\sqrt{2\pi}} e^{-x^2/2} dx = \text{erf}(Z[k]) \quad \text{(Eqaution 24)}$$

The aggregator 510 outputs the confidence score to the controller 205 to determine whether a fault is occurring (FIG. 10).

FIG. 10 is a flowchart illustrating a process 1000 of determining that a fault is occurring based on the confidence score calculated by the process 900 (FIG. 9). During the process 1000, the controller 205 compares the confidence score to a threshold to determine a floating neutral is occurring.

The process 1000 continues from process 900 (FIG. 9). The controller 205 compares the confidence score to a threshold value to determine whether the confidence score is greater than the threshold value (decision block 1005). The confidence score is calculated by the aggregator 510 at block 930. In some embodiments, the threshold value is based on an acceptable false alarm value that is determined via training data. For example, the threshold may be between 0.15 and 0.35. Without comparing the calculated confidence to a threshold value, many false alarms would be raised, thus, improperly causing utilities to redirect resources to an issue that does not exist.

If the controller 205 determines that the confidence score is greater than the threshold value ("YES" at decision block 1005), the process 1000 proceeds to block 1010. If the controller 205 determines that the confidence score is not greater than the threshold value ("NO" at decision block 1005), the process 1000 proceeds to block 1015.

The controller 205 determines that a fault condition is occurring (block 1010). For example, the controller 205 determines that a floating neutral is occurring. The controller 205 determines that a fault condition is NOT occurring (block 1015). For example, the controller 205 determines that a floating neutral is not occurring. In some embodiments, when a floating neutral is occurring, a utility and/or a customer may be alerted.

Figure 11A:
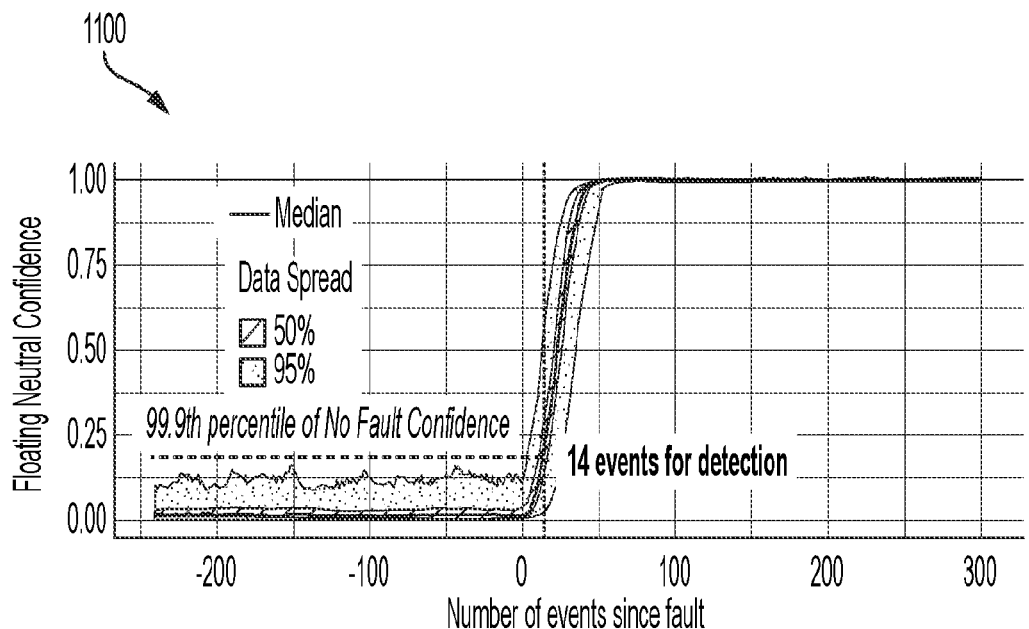
FIGS. 11A & 11B are graphs illustrating floating neutral confidence scores over periods of time according to some embodiments.

FIG. 11A is a graph 1100 illustrating floating neutral confidence scores over a period of time. The graph 1100 illustrates floating neutral confidence scores when a 10 ohm ($\Omega$) return path impedance is occurring. As illustrated by the graph 1100, 14 events passed through the event filter 500 before the confidence score of whether a fault is occurring reached the threshold value to determine that a fault occurred. In some embodiments, the confidence score increases in a generally positive direction over time when a fault occurs.

Figure 11B:
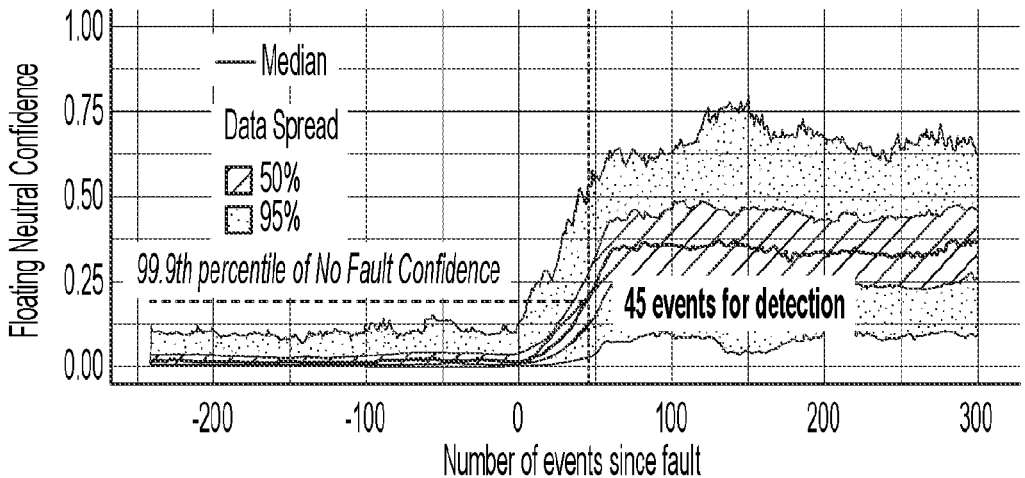

FIG. 11B is a graph 1105 illustrating floating neutral confidence scores over a period of time. The graph 1105 illustrates floating neutral confidence scores when a 2$\Omega$ return path impedance is occurring. As illustrated by graph 1105, 45 events passed through the event filter 500 before the confidence score of whether a fault is occurring reached the threshold value to determine that a fault occurred. In some embodiments, as the floating neutral impedance increases (for example, the fault is a greater fault), the fault detection time decreases.

Figure 12:
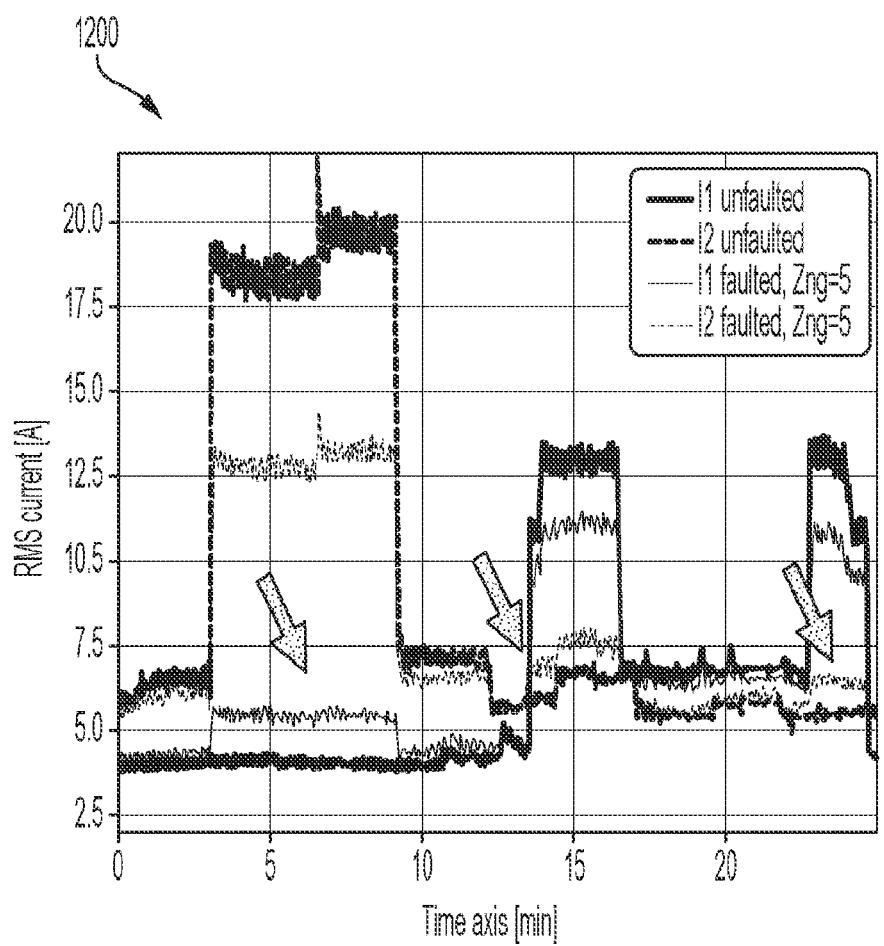
FIG. 12 is a graph illustrating a shadow effect between a first current and a second current according to some embodiments.

FIG. 12 is a graph 1200 illustrating the shadow effect between the first current (for example, "$I_1$"), and the second current (for example, "$I_2$"). The shadow effect occurs when the neutral impedance (for example, "$Z_{ng}$") is abnormally high and a load imbalance occurs between appliances receiving current from the first current or the second current, thus, indicating a fault. For example, as shown in the graph 1200, the second current in the faulted case (I2 faulted) has a higher consumption which is then passed to the first current (I1 faulted) which produces a decreases in the second current and a slight increase in the first current. The higher the load imbalance, the larger the shadow that the second current passes onto the first current.

Figure 13A:
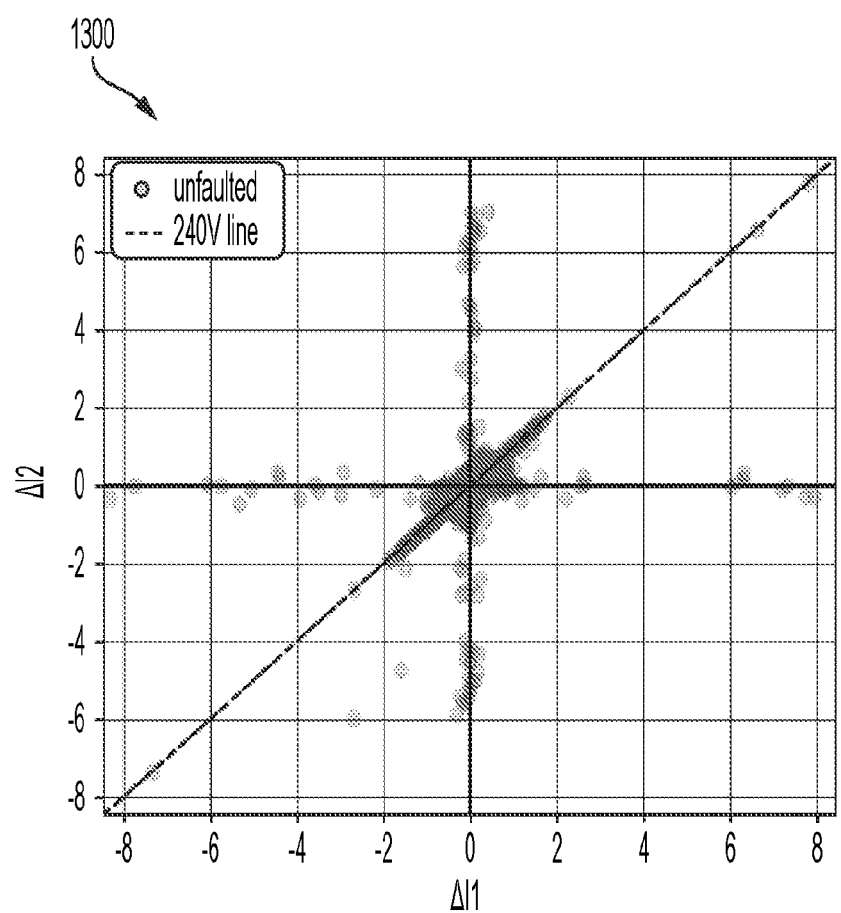
FIGS. 13A & 13B are graphs illustrating variations in the first current and second current according to some embodiments.

FIG. 13A is a graph 1300 illustrating a variation in the first current (for example, "$I_1$"), and the second current (for example. "$I_2$") in an case without a fault. Variations in the currents collected by the meter 100 for subsequent collections may be determined by the fault detector 218 (Equation 25 and Equation 26). The graph 1300 plots the variation of the first current with respect to the variation of the second current. In a case without a fault, variations between samples may be based on no changes in the consumption pattern by appliances (for example, variation points being plotted near the origin), a change in the consumption pattern of an appliance connected to the first current (for example, variation points being plotted on the Y=0 axis), a change in the consumption pattern of an appliance connected to the second current (for example, variation points being plotted on the X=0 axis), and a change in the consumption patter of an appliance connected to both the first current and the second current (for example, variation points being plotted along the X=Y axis). In some embodiments, a change in consumption pattern may be due to an appliance being switched ON or OFF.

$$\Delta I_{1i} = I_1(n) - I_1(n-1) \qquad \text{(Equation 25)}$$

$$\Delta I_{2i} = I_2(n) - I_2(n-1) \qquad \text{(Equation 26)}$$

Figure 13B:
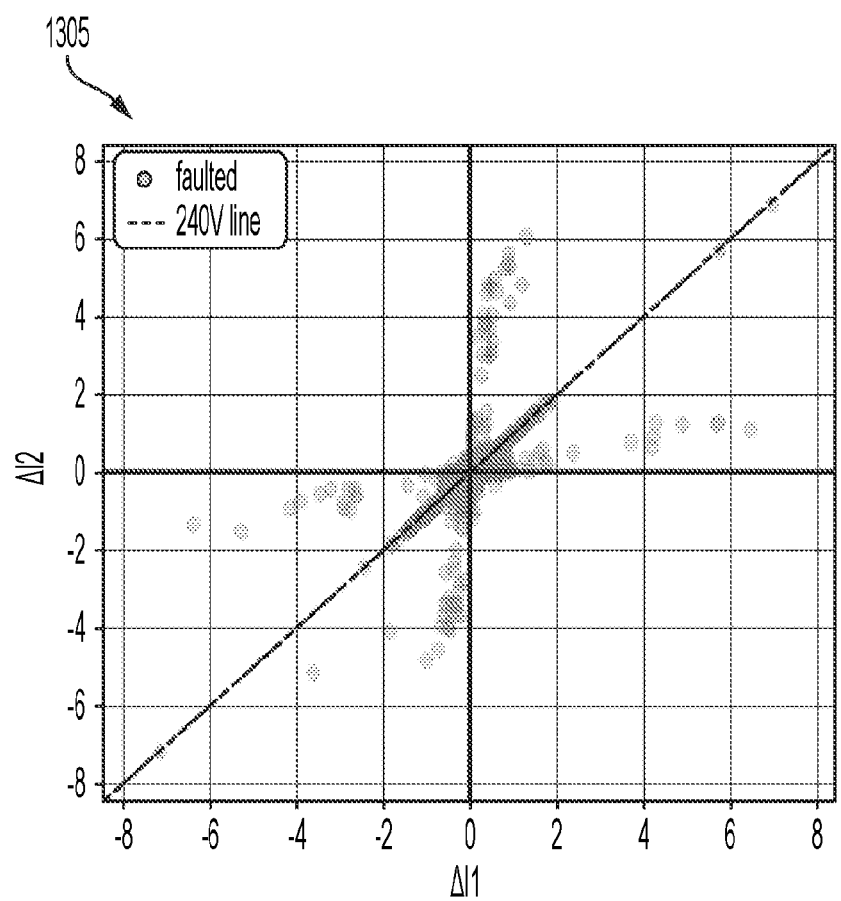

FIG. 13B is a graph 1305 illustrating a variation in the first current (for example, "$I_1$"), and the second current (for example. "$I_2$") in an case with a fault. The graph 1305 plots the variation of the first current with respect to the variation of the second current. As shown in the graph 1305, when a fault is present, the variation points calculated suing Equation 25 and Equation 26 are rotated from the X=0 and Y=0 axis. The rotation/shift of the variation points from the graph 1300 to the graph 1305 is due to the shadow effect that occurs during floating neutral conditions.

Figure 14:
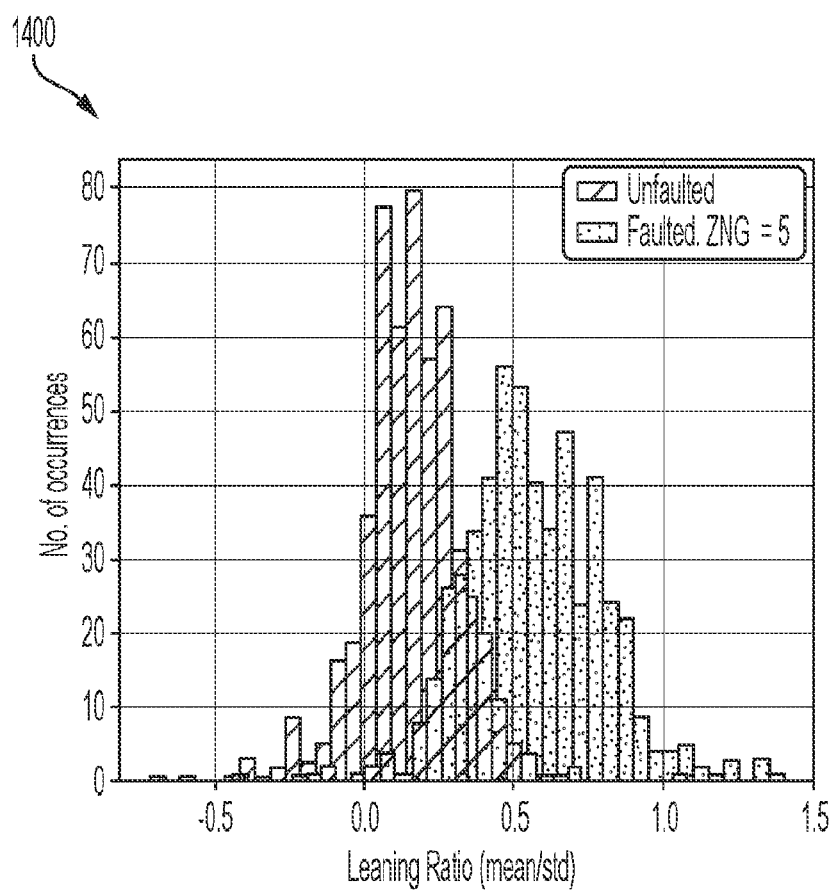
FIG. 14 is a graph illustrating a leaning ratio according to some embodiments.

FIG. 14 is a graph 1400 illustrating a distribution of a leaning ratio. The leaning ratio asses the rotation of the variation points calculated using Equation 25 and Equation 26 (for example, as shown in FIG. 13B). The leaning ration is calculated using the first current variation (for example, $\Delta I_1$) and the second current variation (for example, $\Delta I_2$) (Equation 27). Equation 27 may be evaluated from i=1 to n, n being the length of an observation window. The graph 1400 illustrates the distribution of the leaning ratios over a first time period (for example, six months) in a facility. The higher the neutral impedance (for example, "$Z_{ng}$"), the more shifted to the right the distribution will be, due to a higher intensity of the shadows. In some embodiments, the leaning ratio distribution of graph 1400 is specific to a single facility.

$$LR = \frac{\text{mean}\left(\arctan\left(\frac{\Delta I_{2i}}{\Delta I_{1i}}\right)\right)}{\text{std}\left(\arctan\left(\frac{\Delta I_{2i}}{\Delta I_{1i}}\right)\right)} \qquad \text{(Equation 27)}$$

Figure 15:
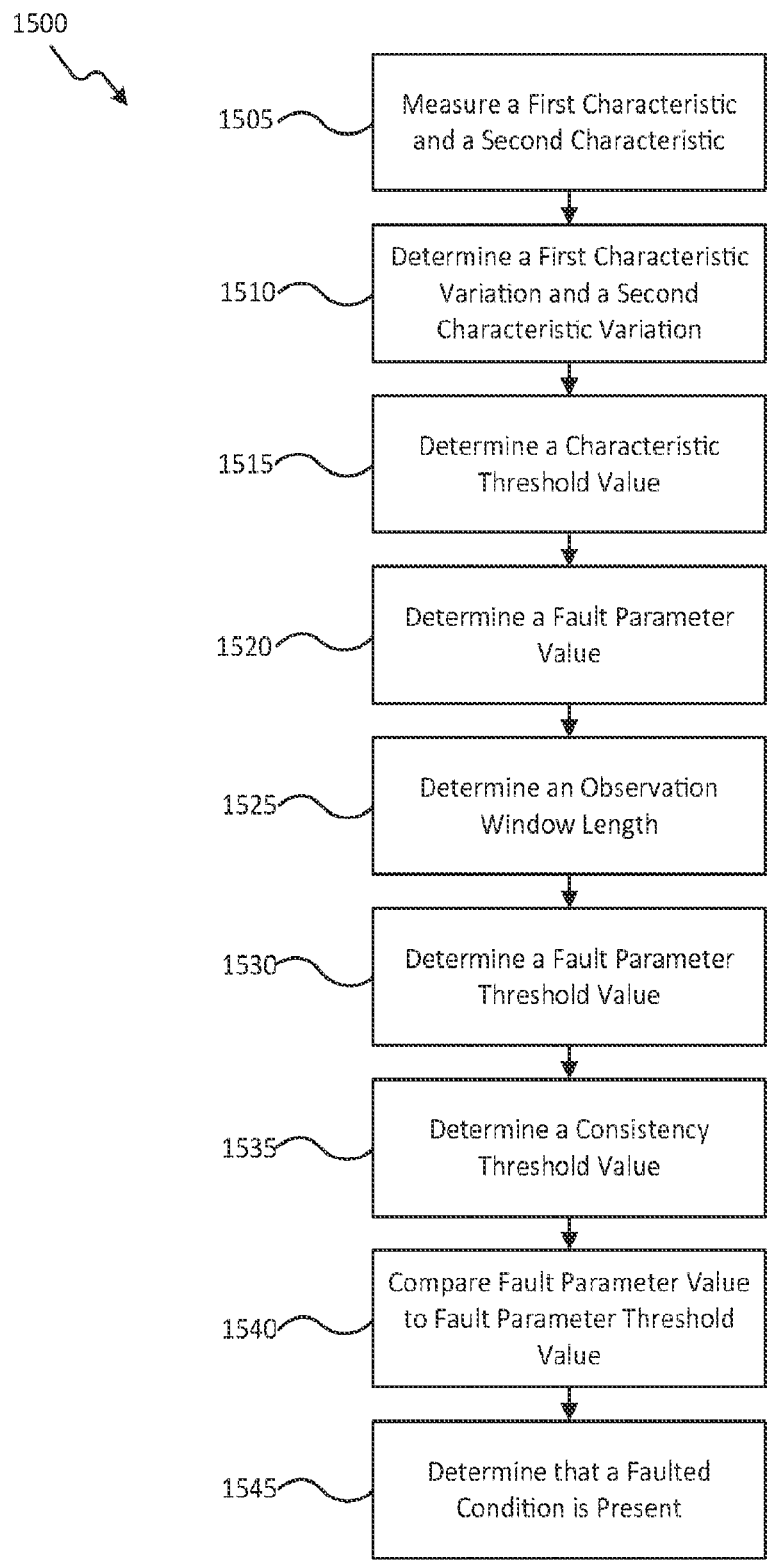
FIG. 15 is a flowchart illustrating a process of determining that a floating natural is occurring based on the leaning ratio according to some embodiments.

FIG. 15 is a flowchart illustrating a fault detection process 1500 based on the shadow effect. During the process 1500. The controller 205 measures a first characteristic and a second characteristic (block 1505). For example, the sensor 225 may sense the first characteristic and the second characteristic. In some embodiments, the first characteristic is a first current (for example, "$I_1$") and the second characteristic is a second current (for example, "$I_2$"). In some embodiments, the characteristics may be sensed over time to collect a group of characteristics. The controller 205 determines a first characteristic variation and a second characteristic variation (block 1510). In some embodiments, the first characteristic variation is a first current variation (for example, $\Delta I_1$) and the second characteristic variation is a second current variation (for example, $\Delta I_2$). For example, the controller 205 determines the first current variation (for example, $\Delta I_1$) and the second current variation (for example, $\Delta I_2$) using Equation 25 and Equation 26, respectively.

The controller 205 determines a characteristic threshold value (block 1515). In some embodiments, the characteristic threshold value is a current noise threshold that separates valid events (for example, not faulted events) from noise (for example, $\Delta I_{noise[A]}$). For example, the current noise threshold may be in the range of 0.5 to 0.9 Amperes (A). The controller 205 determines a fault parameter value (block 1520). In some embodiments, the fault parameter value is a leaning ratio (Equation 27). The controller 205 determines an observation window length (for example, OW[h]) (block 1525). In some embodiments, the observation window length is the amount of time over which the leaning ratio is calculated. For example, the observation window length may be in the range of four to ten hours.

The controller 205 determines a fault parameter threshold value (block 1530). In some embodiments, the fault parameter threshold value is a leaning threshold (for example, LT) that provides a faulted leaning ratio threshold. For example, the leaning threshold may be a range of 0.25 to 0.75, or the like. The controller 205 determines a consistency threshold value (block 1535). The consistency threshold reduces the probability of false alarms by requiring the controller 205 to determine a number of leaning ratios that indicate a fault. For example, the consistency threshold may be in the range of two to eight faulted leaning ratio values calculated at block 1515. In some embodiments, the leaning threshold and the consistency threshold are confidence thresholds that are specific to the facility that includes the meter 100.

The controller 205 compares the fault parameter value to the fault parameter threshold value (block 1540). In some embodiments, the controller 205 compares the leaning ratio to the leaning threshold. The controller determines that a faulted condition is present (block 1545). The faulted condition is present when the comparison of the fault parameter value is within or greater than the leaning threshold. For example, the leaning ratio may be 0.5 which is in the range of the leaning threshold. In some embodiments, the faulted condition corresponds to an unusually high neutral impedance (for example, "$Z_{ng}$"). In some embodiments, the controller 205 of the meter 100 may take in the range of 30 to 60 hours to determine a faulted condition, without a substantial number of false alarms. The time to determine a faulted condition may be dependent on the switching ON and OFF of appliances in a facility.

Thus, the disclosure provides, among other things, a system and method for detecting a floating neutral fault in a neutral conductor. Various features and advantages of the various embodiments disclosed herein are set forth in the following claims.

What is claimed is:

1. An electric utility meter comprising:
  a housing;
  an input interface configured on the housing that receives input electricity from an electricity source; and
  a controller having an electronic processor and a memory, the electronic processor configured to:
   measure a first characteristic and a second characteristic of the input electricity, determine a fault parameter value,
   calculate a confidence score corresponding to the fault parameter value,
   compare the confidence score to a threshold value, and
   determine that a fault is occurring based on the confidence score exceeding the threshold value,
  wherein the electronic processor is configured to calculate the confidence score by:
   calculating a parametric distribution based on the fault parameter value,
   calculating a negative log-likelihood value based on the parametric distribution and the neutral impedance,
   calculating a sample entropy based on the negative log-likelihood value, calculating a z-score based on the sample entropy, and
   calculating the confidence score based on the z-score.

2. The electric utility meter of claim 1, wherein the electronic processor is further configured to determine that the fault is not occurring based on the confidence score being below the threshold value.

3. The electric utility meter of claim 1, wherein the first characteristic is a line-to-line voltage and the second characteristic is a first input current and a second input current.

4. The electric utility meter of claim 1, wherein the first characteristic and the second characteristic are measured using a sampling frequency in the range of 10 kilo-Hertz (kHz) to 20 kHz.

5. The electric utility meter of claim 1, wherein when the sample entropy equals a first preset value, the fault is not occurring.

6. The electric utility meter of claim 1, wherein the negative log-likelihood value is calculated using a plurality of fault parameter values over a first period of time.

7. The electric utility meter of claim 1, wherein the fault parameter value is a neutral impedance that is determined based on a change in the first characteristic relative to a change in the second characteristic when only one load impedance changes.

8. A method for detecting a floating neutral, the method comprising:
  measuring a first characteristic and a second characteristic of an input electricity, determining a fault parameter value,
  determine a confidence score corresponding to the fault parameter value,
  comparing the confidence score to a threshold value, and
   determining that a floating neutral is occurring based on the confidence score exceeding the threshold value,
  wherein the electronic processor is configured to calculate the confidence score by:
   calculating a parametric distribution based on the fault parameter value,
   calculating a negative log-likelihood value based on the parametric distribution and the neutral impedance,
   calculating a sample entropy based on the negative log-likelihood value,
   calculating a z-score based on the sample entropy, and
   calculating the confidence score based on the z-score.

9. The method of claim 8 further comprising:
  determining that a floating neutral is not occurring based on the confidence score being below the threshold value.

10. The method of claim 8, wherein the first characteristic is a first input current and the second characteristic is a second input current.

11. The method of claim 8, wherein the fault parameter value is calculated based on a variation between successive characteristic measurement of the first characteristic and the second characteristic.

12. The method of claim 11, wherein the confidence score includes a leaning threshold value and a consistency threshold value.

13. The method of claim 12, wherein the leaning threshold is 0.35 and the consistency threshold value is five successive fault detections.

14. A system for detecting a floating neutral, the system comprising:
- an electricity source,
- power input cables, and
- an electrical meter, the electrical meter comprising:
  - a housing;
  - an input interface configured on the housing that receives input electricity from the electricity source via the power input cables; and
  - a controller having an electronic processor and a memory, the electronic processor configured to:
- measure a first characteristic and a second characteristic of the input electricity, determine a fault parameter value,
- calculate a confidence score corresponding to the fault parameter value, compare the confidence score to a threshold value, and
- determine that a floating neutral is occurring based on the confidence score exceeding the threshold value,
- wherein the electronic processor is configured to calculate the confidence score by:
  - calculating a parametric distribution based on the neutral impedance,
  - calculating a negative log-likelihood value based on the parametric distribution and the neutral impedance,
  - calculating a sample entropy based on the negative log-likelihood value,
  - calculating a Z-score based on the sample entropy, and
  - calculating the confidence score based on the Z-score.

15. The system of claim 14, wherein the electronic processor is further configured to determine that a floating neutral is not occurring based on the confidence score being below the threshold value.

16. The system of claim 14, wherein the first characteristic is a line-to-line voltage and the second characteristic is a first input current and a second input current.

17. The system of claim 14, wherein when the sample entropy equals a first preset value, a floating neutral is not occurring.

18. The system of claim 14, wherein the negative log-likelihood value is calculated using a plurality of fault parameter values over a first period of time.

* * * * *